United States Patent [19]
Christoffer

[11] 4,023,101
[45] May 10, 1977

[54] MULTIPLE FUNCTION ELECTRICAL MEASURING AND INDICATING APPARATUS

[76] Inventor: Virgil F. Christoffer, 2601 Stoneridge Court, Arlington, Tex. 76014

[22] Filed: Aug. 20, 1975

[21] Appl. No.: 606,290

[52] U.S. Cl. .................................. 324/107; 324/86; 324/115
[51] Int. Cl.² .................. G01R 19/00; G01R 25/00
[58] Field of Search ............ 324/107, 108, 86, 115; 317/47

[56] References Cited

UNITED STATES PATENTS 1,684,056  9/1928  Evans ................................. 324/108

FOREIGN PATENTS OR APPLICATIONS 161,167  6/1922  United Kingdom ............... 324/108

Primary Examiner—Rudolph V. Rolinec
Assistant Examiner—Ernest F. Karlsen
Attorney, Agent, or Firm—Peter J. Murphy

[57] ABSTRACT

For measuring and indicating phase voltage, phase sequence and other electrical values in a three-phase power system, and electrical values in single-phase and DC systems, a unitary instrument or apparatus includes a meter movement and three phase-resistors of equal value which are connected to a common juncture defining a neutral point, with a first phase-resistor connected in series with the meter. The three phases of the external circuit to be tested are connected respectively to the three phase-resistors through a three-pole three-position selector switch for selecting the three different phase to "phase-resistor" relationships. A switch connected between a third phase-resistor and the common juncture performs the alternative functions of opening or closing this circuit. A phase-component of different impedance, resistance or reactance value than the phase-resistors is connected through a switch to the common juncture for connecting this phase-resistor to said common juncture in lieu of the third phase-resistor. Phase voltage can be measured when the three phase-resistors are connected to the common juncture; and phase sequence can be indicated when the phase-component is connected in the circuit for one phase in place of a phase-resistor. An amperage measuring circuit is connected to the meter. A third selector switch separates the voltage measuring and amperage measuring functions; and selects shunt resistors for connection across the meter for different voltage or amperage ranges.

10 Claims, 7 Drawing Figures

MULTIPLE FUNCTION ELECTRICAL MEASURING AND INDICATING APPARATUS

BACKGROUND AND SUMMARY OF THE INVENTION

This invention relates to apparatus, in the form of a unitary instrument, for measuring and indicating a plurality of electrical values and functions of a three-phase alternating current power system, and also single-phase and DC systems.

An object of this invention is to provide novel apparatus for a three-phase power system for measuring and indicating amperage, resistance, line voltage, phase voltage, ground detection, and phase sequence.

Another object of this invention is to provide novel apparatus which performs more of such functions with less components, in relation to known apparatus of this type.

A further object of this invention is to provide apparatus of this type wherein measurements of line voltage, and and phase voltage, and phase sequence detection and ground detection share the same components.

A still further object of this invention is to provide a novel apparatus for measuring and indicating electrical functions, including phase voltage, on any grounded or ungrounded three-phase system, without connection to a neutral or ground of that system.

Still another object of this invention is to provide novel apparatus including means to indicate phase sequence without the aid of lamps or other special equipment.

These objects are accomplished in apparatus which includes a meter movement for indicating the flow of current and the following associated apparatus circuitry. First, second and third phase-conductors serve to connect the three phases of the external circuit to the apparatus circuit. First, second and third phase-resistors, of equal value, are connected to a common juncture, with a first of said phase-resistors being in series with the meter movement. A selector switch connects the three phase-conductors to the three phase-resistors, and selects three alternative connective relationships between the phase-conductors and the phase-resistors. A switch in series with the third phase-resistor and the common juncture selectively opens and closes this circuit. A phase-component having a different impedance than the phase-resistors is connected with the third phase-resistor to a common terminal of the three position selector switch; and a switch in series with the phase-component and the common juncture selectively opens and closes this circuit.

The novel features and the advantages of the invention as well as additional objects thereof will be understood more fully from the following description when read in connection with the accompanying drawings.

DRAWINGS

DESCRIPTION OF THE PREFERRED EMBODIMENT

Figure 1:
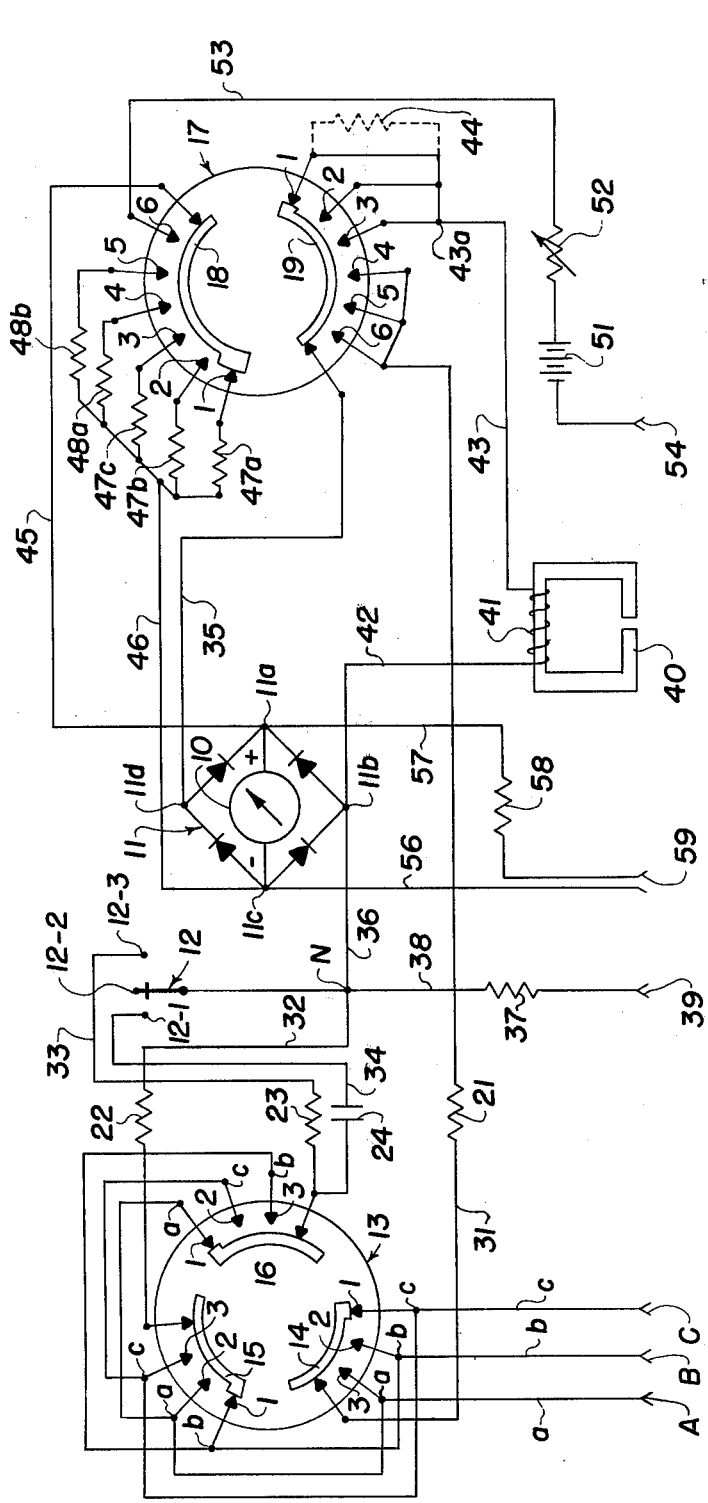
FIG. 1 is a schematic diagram of the overall circuit for the apparatus of the invention.
Figure 5:
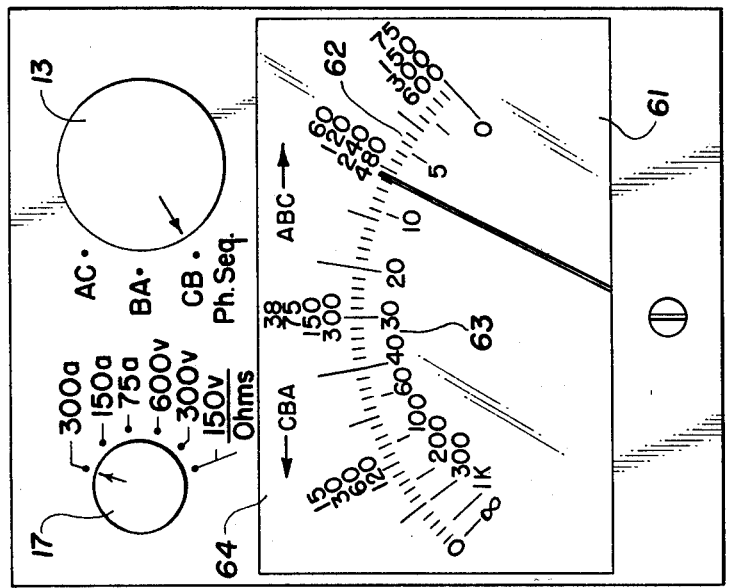

The apparatus of the invention is preferably embodied in a unitary housing, as illustrated in FIG. 5, which will include all of the circuitry of FIG. 1 which will now be described.

The basic measuring and indicating instrument is a meter movement 10 for measuring unidirectional current and which may include a basic D'Arsonval movement for example. The meter 10 is connected in a diode bridge circuit 11 for rectification of alternating current flow through the meter and including meter connection points 11a through 11d. As seen in the drawing the current flow through the meter is from point 11a to 11c.

The several functions of the apparatus are controlled through three selector switches 12, 13 and 17, to be described in detail subsequently, and which variously connect into the apparatus circuits four basic components namely first, second and third-phase resistors 21, 22 and 23, respectively, which have an equal resistance values, and a phase-component illustrated as a capacitor 24, which phase-component has a resistive, reactive or impedance value different from that of the phase-resistors. While the term "phase-resistor" is used herein to distinguish these components 21, 22 and 23 from the component identified as "phase-component" 24, it will be understood that all of these components may be resistors, or all may be reactive components where only AC current is involved.

The selector switch 12 is a single pole, three position switch including switch contacts 12-1, 12-2, and 12-3. The selector switch 13 is a three-pole three-position selector switch including poles 14, 15 and 16; and three switch contacts are associated with each pole. The switch contacts for the pole 14 are identified as 14-1, 14-2 and 14-3; the switch contacts for the pole 15 are identified as 15-1, 15-2 and 15-3; and the switch contacts for the pole 16 are identified as 16-1, 16-2 and 16-3. This selector switch 13 is shown in position 1 wherein the several poles are making their respective number 1 contacts.

The apparatus circuitry includes three phase-conductors a, b and c which terminate in jacks A, B and C at the wall of the apparatus housing. The apparatus may be connected to the external circuit then by means of connector wires having plugs at one end for coaction with the jacks A, B and C and having suitable connectors such as alligator clips at the opposite end for connection to the external circuit. Similar connector wires would be used for connecting the apparatus to the circuit for other functions to be described. Referring to the switch 13 circuit, the phase-conductor a connects switch contacts 14-3, 15-2, and 16-1; the phase-conductor b connects switch contacts 14-2, 15-1, and 16-3; and the phase- conductor c connects switch contacts 14-1, 15-3, and 16-2.

Figure 2:
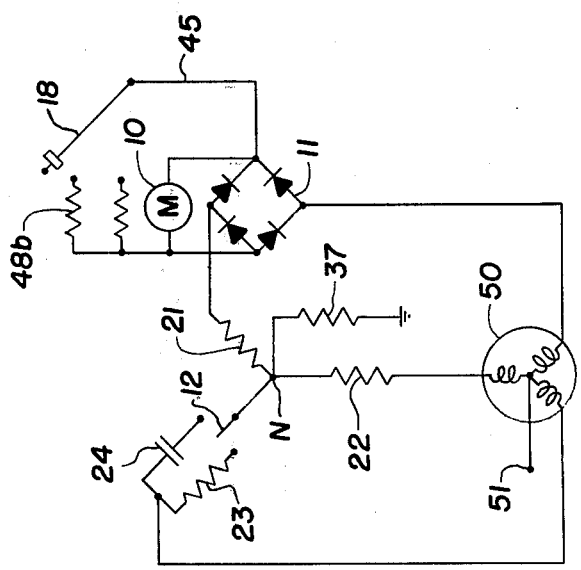
FIG. 2 is a functional schematic illustration of a portion of the circuit of FIG. 1.

The first phase-resistor 21 is connected between the switch pole 14 and a juncture N in a series circuit which includes conductor 31, contacts of selector switch 17, conductor 35, meter 10 and conductor 36. The juncture N is the midpoint or wye intersection of a basic wye circuit, as will be described. This midpoint creates an artificial neutral in the wye circuit. The second phase-resistor 22 is connected between the switch pole 15 and the juncture N directly by means of conductor 32. The third phase-resistor 23 is connected between switch pole 16 and juncture N in a series circuit which includes conductor 33 and the contacts 12-3 of switch 12. The phase-component 24 is also connected between the switch pole 16 and the juncture N in a series circuit which includes the conductor 34 and the switch contacts 12-1 of switch 12. These circuits for the resistor 23 and the component 24, then, are only alternatively closed through the selector switch 12. FIG. 2 is a functional illustration of the connection of the three phase-resistors to the juncture N, when the switch 12 is making its contact 12-3. The switch 12 then has three functions with respect to the circuits connecting the selector switch pole 16 (for the third phase) to the juncture N. In position 1, contact 12-1 is made to close the circuit including component 24. In position 2, contact 12-2 is made to open the circuit between pole 16 and juncture N. In position 3, contact 12-3 is made to close the circuit including phase-resistor 23.

A component 37 is connected to the juncture N by means of conductor 38 terminating in jack 39; and this circuit is used for the ground detection function to be described. The component 37 has a resistive, reactive, or impedance value preferably higher than the phase-resistors 21, 22, and 23. This higher value restricts the current through the meter 10, in any of the three of switch 13 positions, to not more than that desired for fullscale meter deflection. This value could of course be any desired value that would not cause damage to the meter movement.

Referring now to the selector switch 17, this is a two pole six position selector switch which actually functions as two individual selector switches. This switch has poles 18 and 19 each of which have respective associated contacts 1 through 6 identified in relation to rotary switch positions 1 through 6. Pole 18 is preferably a shorting pole, since it is used to connect shunt resistors across the meter 10 as will be described. Pole 19 may be a nonshorting pole and is used to separate between the voltage measuring and current measuring functions of the apparatus.

For the pole 19, its associated contacts 4, 5 and 6 are connected in the voltage circuit with the conductor 31 so that, in any of switch positions 4, 5 and 6 the phase-resistor 21 is connected in series with the meter 10 as described above. The associated contacts 1, 2 and 3 are connected in the amperage circuit which will now be described. This circuit includes a split core transformer including a hinged core 40, capable of being clamped around a single conductor to detect current flow, and an associated coil 41. The coil 41 is connected in series with the meter juncture 11b by means of conductor 42, and with the switch contacts 19-1, 19-2 and 19-3 by means of conductor 43. The series circuit to the meter juncture 11d is then completed through the pole 19 and conductor 35. The switch pole 19 then functions as a selector switch for the amperage circuit; however the branch circuits including the switch contacts 19-1, 19-2 and 19-3, connected to the common point 43a, may include series resistors (such as the indicated resistor 44 in series with contact 19-1). Referring to the pole 18 of switch 17, this pole is connected to the meter juncture 11a by means of conductor 45; and its associated contacts, 1 through 5 are connected to the meter juncture 11c by means of conductor 46 and branch circuits including shunt resistors 47a, 47b, 48a and 48b connected to respective switch contacts 18-1, 18-2, 18-3, 18-4 and 18-5. These switch contacts then place the respective resistors in shunt across the meter 10.

For the amperage circuit a resistor 47a (position 1) may select an ampere range of 300 amps for example, the resistor 47b (position 2) may select a range of 150 amps; and the resistor 47c (position 3) may select a range of 75 amps.

For the above described split core transformer 40, the current carrying conductor, under test, becomes the transformer primary; and the coil 41 is the secondary winding. The transformer output fully is proportional to the current measured; and is connected to selected shunt resistors 47a, 47b, 47c for selected amperage ranges.

For the voltage measuring circuit contact 18-6, made in position 6, is open with respect to the meter circuit and accordingly there is no shunt resistor. This position, then, selects the lowest meter range of 150 volts for example, wherein the current through the meter is determined by such of the phase-resistors 21, 22 and 23 or the components 24 or 37 which may be connected in the meter circuit. In position 5 resistor 48b is connected in shunt to select a voltage range to 300 volts for example; and in position 4 resistor 48a is connected in shunt to select a range up to 600 volts.

The ohmmeter circuit for the apparatus includes battery 51 and variable resistor 52, connected in series by means of conductor 53 connected to the switch contact 18-6 and terminating in jack 54. This circuit is connected to the meter juncture 11a with the switch 17 in position 6 and the other side of the meter at point 11c is connected to a jack 59 by means of conductor 56. Jack 59 is a split jack which also connects resistor 58 in series with meter juncture 11a through conductor 57; and when a plug is inserted into the jack 59 for use of the ohmmeter circuit, this jack automatically connects the resistor 58 in shunt with the meter 10.

LINE VOLTAGE MEASUREMENT

For measuring line voltage (phase-to-phase voltage) in a three-phase system, switch 12 is placed in position 2 so that only two of the three phases connected to the apparatus by the jacks A, B and C are connected in the apparatus circuit. Referring to the illustrated "position 1" of selector switch 13, phases C and B are connected respectively to poles 14 and 15 and thereby in series with the meter 10 and resistors 21 and 22 to measure the C-B line voltage. In position 2, phases B and A would be connected respectively to the poles 14 and 15 for measuring the B-A line voltage. Similarly for position 3, phases A and C are connected respectively to poles 14 and 15 for measuring the C-A line voltage. For this operation the apparatus is effectively measuring single-phase voltage; and accordingly the apparatus may be used for measuring line voltage in single phase systems, and also voltage in a DC system.

FIG. 2 is a functional schematic diagram illustrating the line voltage, phase voltage, phase sequencing and ground detection operations of the apparatus, with the apparatus being connected to an external three-phase system represented by an alternator 50 in a wye system and having a neutral or ground point 51. FIG. 2 illustrates particularly how common components are used for the several indicating functions including line voltage, as above described, phase voltage, phase sequence, and ground detection.

Phase Voltage Measurement

For phase voltage measurement the switch 12 is in position 3 making contacts 12-3 wherein the three phase-resistors 21, 22 and 23 are connected to the juncture N. Since these resistors are of equal value, a balanced wye load produces a current through each resistor proportional to the phase voltage applied to that resistor. Each resistor current will be equal to the voltage of each phase divided by the resistance of the same phase resistor, i.e.

$$I_{ph} = E_L/(\sqrt{3}) R_{ph}$$

The line voltage is first found to determine if phase voltage can be measured. If the approximate line voltage is not known the selector switch 17 is preferably initially set on the highest voltage position (position 4); and then shifted to a lower position for more accurate reading. If this line voltage, for example, is not over 520 volts relative to the scale in FIG. 5 (600v) then switch 12 is connected to position 12-3. When in position 12-3 the phase voltage is read on the next lower scale (300v). The meter will show a higher voltage reading because the added voltage of phase A (relative to FIG. 1) is connected to the wye circuit through resistor 23, i.e.

$$\frac{E_{ph}}{R_{21ph}} > \frac{E_L}{R_{21} + R_{22}}$$

For position 1 of selector switch 13, phase C is connected through pole 14 and meter 10 and accordingly the phase C voltage is indicated. By the same token for position 2 the phase voltage for phase B is indicated, and for position 3 the phase voltage of phase A is indicated.

Phase Sequence Detection

For phase sequence detection, switch 12 is shifted to make its contacts 12-1 to connect phase-component 24 between pole 16 and juncture N to create an unbalanced wye circuit including the phase-resistor 21 and 22 and the phase-component 24. As mentioned, the phase-component 24 has a resistive, reactive or impedance value different from the equal phase-resistors 21 and 22.

With this connection an unbalanced wye load is connected to the three phase external circuit such as the alternator 50 (FIG. 2). With an absence of a connection to a neutral point 51, there is a shift in the phase current proportional to the shift in the phase voltage. This shift of voltage and current is the same basic effect utilized in conventional phase-sequence indicators. The design of this system allows phase-sequence to be indicated without the aid of lamps or other special equipment.

To obtain the correct phase sequence, the switch 13 must remain in a predetermined position since if the switch position is changed, the phase-sequence may also be changed. Assuming that position 1 is selected, the phase C current through resistor 21 is indicated in the meter. With one phase-sequence, the unbalanced wye load causes a high current flow in one of the equal phase-resistors 21 or 22 and a low current flow in the other. For example, if a phase-sequence (ABC) is applied to the instrument relative to the illustrated jacks A, B, C then the phase C current indicated by the meter 10

$$I_{CN} = \frac{E_{AC} Z_{22} - E_{CB} Z_{24}}{Z_{24} Z_{22} + Z_{24} Z_{21} + Z_{22} Z_{21}}$$

would be lower than line voltage and the current of phase B, not indicated through meter 10.

$$I_{BN} = \frac{E_{CB} Z_{24} - E_{BA} Z_{21}}{Z_{24} Z_{22} + Z_{24} Z_{21} + Z_{22} Z_{21}}$$

would be higher than line voltage. With the opposite phase-sequence applied (CBA) the currents $I_{CN}$ and $I_{BN}$ would be reversed.

This high or low current flow through the meter produces a respective high or low voltage reading on the meter scale, depending on the phase-sequence; and this high or low voltage reading is to be compared with the system line voltage reading, which would have been observed as previously described. So in this phase-sequencing operation, then, the line voltage would first be determined with the switch 12 making contact 12-2, and with the switch then being shifted to make contact 12-1 for the phase-sequencing determination. If the phase-sequencing voltage reading is higher than the line voltage, one phase-sequence is indicated; and if the voltage reading is lower than the line voltage the opposite phase-sequence is indicated. Appropriate marking 64 are provided on the meter face as indicated in FIG. 5 for example, to show the phase-sequence according to the direction the meter pointer moves away from the indicated line voltage.

GROUND DETECTION

Certain of the above described voltage measuring circuitry is also used for the ground detection function; and this brings in to use the resistor 37 connected to the juncture N; and for this function the switch 12 is placed in position 2 so that the third phase pole 16 of the selector switch 13 is not connected to the juncture N. The resistors 37, then, are connected in a wye circuit with the juncture N. Component 37 as stated previously has a resistive, reactive, or impedance value preferably higher than the phase-resistors 21, 22, and is connected with them at juncture N. Through the jack 39, the component 37 is connected to an external ground. The line voltage would be the reference point from which there would be an indication of a grounded phase. Any change in the line voltage reading either lower or higher indicates there is a grounded phase. Assuming that one of the phases A, B, or C is grounded the changing of selector switch 13 between the three positions will indicate two voltage readings higher than line voltage and one lower. (Or, depending on the value of component 37 there could be two voltage readings lower than line voltage and one higher). In either case the position of the switch for the lowest voltage reading will indicate the grounded phase; and it is the phase indicated by the first letter for the particular switch position which is the grounded phase. For this function only poles 14 and 15 of the selector switch 13 are used; switch position 1 connecting phases C and B in the circuit; switch position 2 connecting phases B and A in the circuit; and switch position 3 connecting phases A and C in the circuit. Accordingly if switch position 3 produces the lowest voltage reading, for example, phase A is indicated to be the grounded phase.

Current Measurement

For current measuring the selector switch 17 is positioned at the desired range position, position 1, 2 or 3 and the split core 40 of the transformer is coupled around the conductor to be tested, with the current then being read on the meter dial 10. If the approximate current value is not known, the selector switch 17 is preferably initially set on position 1 for the highest range; and then shifted to position 2 or 3 if desired for a more accurate reading. With a hinged and spring loaded split core transformer, the transformer is readily coupled and uncoupled to and from a single conductor to be tested.

Resistance Detection

Figure 4:
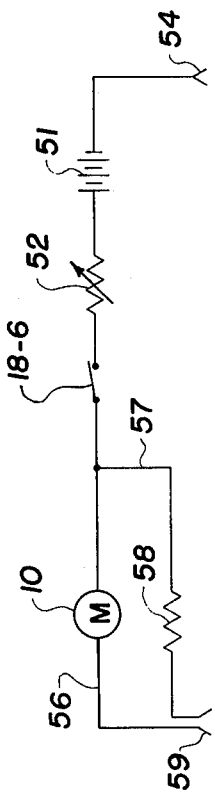
FIG. 4 is a functional schematic illustration of the ohmmeter subcircuit of FIG. 1.

For resistance detection, connector wires with respective plugs are inserted into the jacks 54 and 59, with the respective alligator connectors connected to the circuits to be tested. Prior to connecting this ohmmeter circuit to the circuit to be tested, the selector switch 17 is placed in position 6 which places the battery 51 and variable resistor 52 in series with the meter 10, and the jacks 54 and 59 are connected together through the connectors. The variable resistor 52 is then adjusted to produce a zero reading on the ohmmeter scale, and this compensates for changes in potential available from the battery 51. The shunt resistor 58 is connected across the meter through the split jack 59. The functional circuit is illustrated in FIG. 4; and the resistance will then be indicated on the ohm meter scale of the apparatus.

The battery side of the ohmmeter circuit is connected to the low voltage range switch contact 18-6 where there is no connection to a shunt resistor. Accordingly this low voltage range circuit and the ohmmeter circuit share the same switch contact 18-6; and because the circuit is designed wherein the lowest voltage range is calculated without a shunt resistor, there will of course be no shunt resistor connected in parallel with the resistor 58 when the ohmmeter circuit is used.

Apparatus and General Circuit

Figure 6:
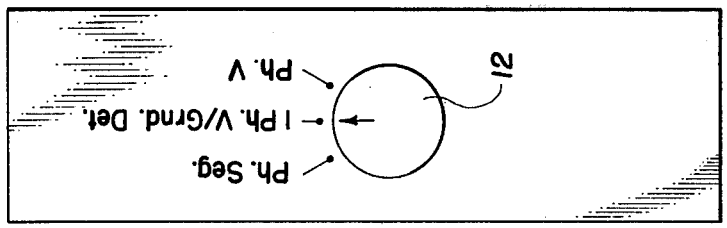
FIGS. 5, 6 and 7 are respective front, side and bottom views of an apparatus housing including dial face and switch control knobs and indicia.
Figure 7:
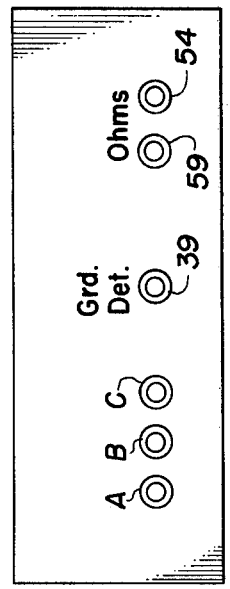

FIGS. 5, 6 and 7 illustrate a box-shaped housing 60 for the apparatus of the invention including a dial face window 61, operator knobs 12, 13 and 17 for the respectively numbered rotary switches, and the jacks designated A, B, C, 39, 54 and 59. Indicia associated with each of the switch knobs identify the functions associated with the respective switch positions as described above. the dial face includes one linear scale 62, which is shared by four range scales having the ranges: 0–75, 0–150, 0–300. and 0–600 reading from left to right; and these range scales are shared for the voltage and amperage readings. The lower scale 63 reading from right to left is a nonlinear scale for the ohm readings of the resistance measuring circuit.

Relative to voltage measurement the four linear scales represent a maximum 600 volts (1 ph or DC) and 520 volts (3ph line voltage); 300 volts (1ph or DC) and 260 volts (3ph line voltage); 150 volts (1ph or DC) and 130 volts (3ph line voltage); and 75 volts (phase voltage) the next lower scale required for the 150 volt range. The marking of the apparatus dial face must be done differently from conventional multimeters. The standard three-phase voltage systems should be considered. Examples of these systems would be 480 volts (line voltage), 240 volts (line voltage) and 115 volts (line voltage) which are the most common. For example starting with the higher voltage 480 volts, the phase voltage should be equal to $$480/ \sqrt{3} = 277 \text{ volts}$$

This highest phase voltage would be used in determining the value of all components of voltage, phase sequence, and ground detection functions. This is because the maximum voltage drop across each phase-resistor 21, 22 or 23 when threee phase is applied will be the maximum that will also drop across resistors 21 or 22 when single phase or DC is applied for line detection.

Depending upon the position of switch 13 the total single phase or DC voltage applied across the two equal resistors 21 and 22, 22 and 23, or 23 and 21 will be divided equally because of their series connection.

$$R_{21} = R_{22} = R_{23}$$

So with a constant voltage $I_T = I_{21} = I_{22} = I_{23}$, therefore
$E_{21} = (I_T) (R_{21})$
$E_{22} = (I_T) (R_{22})$ so
$E_{23} = (I_T) (R_{23})$
$E_T = E_{21} + E_{22}$
$E_T = E_{22} + E_{23}$
$E_T = E_{23} + E_{21}$ For conventional multimeters designed for power systems the highest voltage range is usually 600 volts (single phase, AC, or DC). The phase voltage of a 520 volt three-phase system (600/2), for example, would determine the maximum single phase AC or DC voltage to be applied.

$$\frac{520}{\sqrt{3}} (2) = 600 \text{ volts}$$

Because the divisions on the meter face are even numbered the maximum single-phase AC or DC voltage should be 600 volts in lieu of 554 volts $$\left( \frac{480}{\sqrt{3}} \times 2 \right),$$

$(480/ \quad 3 \times 2)$,
so conversely the maximum three phase line voltage would then be $$\left( \frac{600}{2} \right)\left( \sqrt{3} \right) = 520 \text{ volts}$$

So for a 520 volt three phase maximum range, a 600 volt scale (for single phase, AC or DC voltage) must be provided and a 300 volt scale (for the phase voltage function) must be provided. If for example the maximum range was 520 volts (3-phase), then the current through resistors 21 and 22, relative to FIG. 2 at 600 volts single phase AC or DC, would be exactly the same, and proportional to the current through resistors 21, 22 and 23 when switch 12 is connected to resistor 23 and 520 volt three phase AC is applied. So relative to FIG. 1 and FIG. 2, both current would be equal, i.e.

$$I_{CB} = \frac{(E_{ph}(2)}{R_{21} \, J \, R_{22}} = I_{CN} = \frac{E_{ph}}{R_{21}}$$

The resultant meter voltage reading is also directly proportional and equal to each of these currents. So when switch 12 is connected to resistor 23 and three phase AC is applied, the next lower voltage scale is to be used rather tha the scale indicated by the range selector switch 17. For example, the range selector switch 17 would show a 600 volt single phase AC or DC range but would also be the 300 volt phase voltage range when three phase AC is applied. So if 480 volts three phase is applied and switch 12 is in the center position the 600 volt scale would read 480 volts. When switch 12 is connected to resistor 23 and three phase is applied then the 300 volt scale would read 277 volts $$\left(480_L \div \sqrt{3}\right).$$

Each different voltage range must be provided with two different scales. One will be for single-phase AC or DC and the other for the phase voltage of three-phase systems.

A panel meter for power distribution panels could also be constructed for three-phase system voltages using the switch 13, basic phase-resistors 21, 22, and 23, bridge-diode 11, and meter 10. This type panel meter could be used for checking each individual phase voltage on any three-phase AC system. The three equal phase-resistors (or equal reactive components) would be calculated according to the current of the meter movement so that $$X_{Lph} \text{ or } X_{Cph} \text{ or } R_{ph} = \frac{E_{ph}}{I \text{ meter (full scale)}}$$

Figure 3:
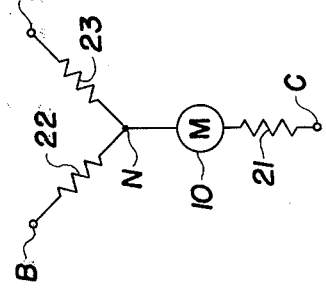
FIG. 3 is a diagrammatic illustration of a basic relationship of the circuit of FIG. 1.

The basic components 21, 22, 23 and 24 are calculated to allow tha shunt method to work relative to the meter full scale current. With the meter 10 in series with the basic wye circuit, as shown in FIG. 3, the resistance values would be calculated for the lowest voltage range as selected by the switch 17 through its contacts 18-6. The total current through each phase-resistor, with a balanced three phase voltage, would not exceed the full scale current of the meter 10 such that $$I_m \text{ (full scale)} = \frac{E_L}{\sqrt{3} \, R_{ph}} \text{ so } R_{ph} = \frac{E_{ph}}{I_m \text{ (full scale)}}$$

If a higher voltage range is desired, a shunt resistor must be provided to allow a bypass of excess current over the meter full scale current. This shunt resistor is needed because a higher voltage is applied to the same resistors, therefore there is a larger current. So for a three-phase system $$\frac{E_L}{\sqrt{3} \, R_{ph}} - I_m = I_{sh}$$

or for a single phase or DC system relative to the maximum three phase voltage range $$\frac{E_{ph}(2)}{R_{22} \, R_{21}} - I_m = I_{sh}$$

Then the shunt resistance is equal to $$\frac{R_m \, I_m}{I_{sh}} = R_{sh}$$

Features and Advantages

What has been described is an instrument of unique design which allows more functions in a standard multimeter, but which uses far fewer components than would be expected. This instrument does away with the need for a phase sequence indicator as a separate instrument. With available instruments, the functions of line voltage, amperage and resistance measurement can be performed. With the instrument of this invention the additional functions of phase voltage, phase sequence, and around detection can be performed. The phase-voltage function cannot be performed with conventional instruments of this general type.

The combination of the voltage and phase sequence functions are made possible from the basic wye connected circuit in the apparatus circuitry, which is particularly illustrated diagrammatically in FIG. 2. The phase-resistors 21 and 22 are always used for the functions of line voltage, phase voltage, phase sequence, and ground detection. Phase-resistor 23 is switched into the basic wye circuit for the phase voltage function; phase component 24 is switched into the basic wye circuit for the phase sequence function; and resistor 37 is connected into the basic wye circuit for the ground detection function.

With this apparatus the voltage of each individual phase of a three-phase system can be detected for any ungrounded or grounded three-phase wye or delta system, without connection to a ground or to a neutral of that system.

The design of this apparatus allows three-phase sequence to be indicated without the aid of lamps or other special equipment.

While the preferred embodiment of the invention has been illustrated and described, it will be understood by those skilled in the art that changes and modifications may be resorted to without departing from the spirit and scope of the invention.

What is claimed is:

1. In apparatus for measuring electrical values of a circuit to be tested
a meter for indicating the flow of alternating current, and associated apparatus circuitry comprising
three phase-resistors; three phase-conductors for connecting the three phases of an external circuit to the measuring apparatus circuit;
a selector switch for connecting said three phase-conductors to said phase-resistors, and for selecting each of three connective relationships between said three phase-conductors and said three phase-resistors;
means connecting said three phase-resistors to a common juncture; said meter being connected in series with a first one of said phase-resistors;

switch means for selectively connecting and disconnecting a third one of said phase-resistors to and from said common juncture;
a phase-component connected with said third phase-resistor to a common terminal of said selector switch; and switch means for selectively connecting and disconnecting said phase-component to and from said common juncture.

2. Apparatus as set forth in claim 1
said three phase-resistors and said common juncture defining a basic wye circuit, with said three phase-resistors having equal impedance values; and said phase-component being alternatively connected in said basic wye circuit, with said phase-component having an impedance value different from that of a phase-resistor.

3. Apparatus as set forth in claim 1
a second selector switch for alternatively connecting selected shunt resistors across said meter.

4. Apparatus as set forth in claim 1
a ground detection component; a ground conductor for connecting said common juncture to an external ground, and including said ground detection component in series.

5. Apparatus as set forth in claim 4
said ground detection component having an impedance value higher than that of said phase-resistors.

6. Apparatus as set forth in claim 1
an amperage measuring circuit comprising a transformer having a split core member for selectively enclosing a test conductor, and a coil associated with said core defining a transformer secondary; and means connecting said coil in series with said meter and with isolation switch means.

7. Apparatus as set forth in claim 3
an amperage measuring circuit connected in series with said meter; isolation switch means for selectively isolating said amperage measuring circuit and the voltage measuring circuit.

8. Apparatus as set forth in claim 7
selector switch means for alternatively connecting selected shunt resistors across said meter; said selector switch means being operatively associated with said isolation switch means, for connecting first selected shunt resistors in said amperage measuring circuit, and for connecting second selected shunt resistors in said voltage measuring circuit.

9. Apparatus as set forth in claim 1
a resistance measuring circuit comprising means connecting a DC battery, a variable resistor, and isolation switch means in series with said meter; means connecting a shunt resistor across said meter; and means for isolating said shunt resistor from said meter circuit, for other functions of said apparatus.

10. Apparatus as set forth in claim 9
shunt resistor isolating means comprising a split-element jack normally opening said shunt resistor circuit; and said shunt resistor circuit being closed by a coacting connector plug for connecting said resistance circuit to the external circuit being tested.

* * * * *